(12) United States Patent
Chen et al.

(10) Patent No.: US 8,462,504 B2
(45) Date of Patent: Jun. 11, 2013

(54) AIR-COOLED HEAT EXCHANGER AND ELECTRONIC DEVICE WITH SAME

(75) Inventors: Lee-Long Chen, Taoyuan Hsien (TW);
Zse-Hsin Wang, Taoyuan Hsien (TW);
Ying-Chi Chen, Taoyuan Hsien (TW);
Ya-Sen Ty, Taoyuan Hsien (TW);
Chien-Hsiung Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 276 days.

(21) Appl. No.: 13/078,139

(22) Filed: Apr. 1, 2011

(65) Prior Publication Data

US 2012/0160448 A1    Jun. 28, 2012

(30) Foreign Application Priority Data

Dec. 23, 2010    (TW) ................................ 99145498 A

(51) Int. Cl.
*H05K 7/20* (2006.01)
(52) U.S. Cl.
USPC ...... 361/696; 165/121; 165/122; 165/104.33; 165/104.34; 361/695
(58) Field of Classification Search
USPC ................................................ 361/696, 701
See application file for complete search history.

(56) References Cited

U.S. PATENT DOCUMENTS

| | | | |
|---|---|---|---|
| 4,386,651 A * | 6/1983 | Reinhard | 165/104.33 |
| 5,467,250 A * | 11/1995 | Howard et al. | 361/696 |
| 6,039,111 A * | 3/2000 | Kawaguchi et al. | 165/104.14 |
| 7,100,682 B2 * | 9/2006 | Okamoto et al. | 165/104.34 |
| 7,245,485 B1 * | 7/2007 | Morrell | 361/679.48 |
| 2001/0052412 A1 * | 12/2001 | Tikka | 165/299 |
| 2003/0085025 A1 * | 5/2003 | Woods et al. | 165/104.33 |
| 2005/0061485 A1 * | 3/2005 | Hirafuji et al. | 165/104.21 |
| 2006/0032609 A1 * | 2/2006 | Fernandez et al. | 165/54 |
| 2009/0052132 A1 * | 2/2009 | Fernandez | 361/696 |
| 2009/0225513 A1 * | 9/2009 | Correa et al. | 361/700 |
| 2012/0063087 A1 * | 3/2012 | Wei | 361/696 |

* cited by examiner

*Primary Examiner* — Gregory Thompson
(74) *Attorney, Agent, or Firm* — Kirton McConkie; Evan R. Witt

(57) ABSTRACT

An air-cooled heat exchanger includes a casing, a first heat-exchanging core, a second heat-exchanging core, a first internal driving device, a second internal driving device and an external driving device. The first internal driving device is used for driving a first internally-circulated airflow to flow along a first internal circulation path. The second internal driving device is used for driving a second internally-circulated airflow to flow along a second internal circulation path. The external driving device is used for driving a first externally-circulated airflow to flow along a first external circulation path and driving a second externally-circulated airflow to flow along a second external circulation path. The first heat-exchanging core is configured to perform heat exchange between the first internally-circulated airflow and the first externally-circulated airflow. The second heat-exchanging core is configured to perform heat exchange between the second internally-circulated airflow and the second externally-circulated airflow.

20 Claims, 7 Drawing Sheets

AIR-COOLED HEAT EXCHANGER AND ELECTRONIC DEVICE WITH SAME

FIELD OF THE INVENTION

The present invention relates to a heat exchanger, and more particularly to an air-cooled heat exchanger. The present invention relates to an electronic device with such an air-cooled heat exchanger.

BACKGROUND OF THE INVENTION

With rapid development of high-tech industries, various electronic devices (e.g. computers, servers, power supply apparatuses, network devices and communication devices) become essential in our lives. As known, the heat-dissipating efficacy of the electronic device influences the operating stability and the use life of the overall system. For increasing the heat-dissipating efficacy of the electronic device, a cooling device is usually installed within the electronic device or the ambient environment in order to cool the electronic device.

Take a communication device for example. If the heat generated by the communication device fails to be quickly dissipated away by a passive heat-dissipating mechanism, the temperature within the communication device is gradually increased. The elevated temperature may deteriorate the performance of the communication device or cause damage of the communication device. For removing the heat, the communication device is usually equipped with a cooling device. Moreover, it is necessary to prevent the external dust or moisture from entering the communication device during operation of the cooling device.

As known, an air-cooled heat exchanger is one of the common cooling devices for guiding the ambient air to cool the electronic components within the electronic device. FIG. 1 is a schematic view illustrating a conventional air-cooled heat exchanger. As shown in FIG. 1, the air-cooled heat exchanger 1 includes a casing 10, a heat-exchanging core 11, a first fan 12 and a second fan 13. The heat-exchanging core 11, the first fan 12 and the second fan 13 are installed within the casing 10. The heat-exchanging core 11 and the casing 10 define an internal circulation path 14 and an external circulation path 15, which are separated from each other. The first fan 12 is disposed in the internal circulation path 14 for driving internal airflow. That is, the first fan 12 is used for inhaling the hot indoor airflow from the electronic component 20 of the electronic device 2 through a first side of the casing 10 along the internal circulation path 14. The second fan 13 is disposed in the external circulation path 15. That is, the second fan 13 is used for inhaling the cool ambient airflow into the external circulation path 15 through a second side of the casing 10. The heat-exchanging core 11 is used for performing heat exchange between the hot indoor airflow and the cool ambient airflow. That is, by the heat-exchanging core 11, the heat of hot indoor airflow is transferred to the surroundings, and the cooled indoor airflow is guided to the electronic component 20 of the electronic device 2. Consequently, the temperature within the electronic device 2 is reduced.

However, as the power required for the electronic device 2 is increased, the air-cooled heat exchanger 1 needs to be scaled up. Under this circumstance, the size of the heat-exchanging core 11 needs to be increased. Since the conventional air-cooled heat exchanger 1 has a single heat-exchanging core 11, the overall length of the internal circulation path and the external circulation path is too long. In this situation, the wind resistance is increased so that the airflow capacity is too low to effectively enhance the heat-dissipating efficacy. Moreover, as the size of the heat-exchanging core 11 is increased, the cost of fabricating the heat-exchanging core 11 is largely increased.

SUMMARY OF THE INVENTION

It is an object of the present invention to provide an air-cooled heat exchanger with dual heat-exchanging cores for reducing the overall length of the internal circulation path and the external circulation path, reducing the wind resistance and enhancing the heat-dissipating efficacy. Moreover, as the size of the heat-exchanging core is increased, the cost of fabricating the heat-exchanging core is effectively reduced.

In accordance with an aspect of the present invention, an air-cooled heat exchanger is provided. An air-cooled heat exchanger includes a first internal circulation path, a first external circulation path, a second internal circulation path, a second external circulation path, and an external driving device. The first internal circulation path is utilized for guiding a first internally-circulated airflow. The first external circulation path is disposed next to the first internal circulation path for guiding a first externally-circulated airflow. The second internal circulation path is utilized for guiding a second internally-circulated airflow. The second external circulation path is disposed next to the second internal circulation path for guiding a second externally-circulated airflow. The external driving device is disposed in the first external circulation path and the second external circulation path at the same time for driving the first and second externally-circulated airflows at the same time.

In accordance with an aspect of the present invention, heat exchange is performed between the first internally-circulated airflow and the first externally-circulated airflow, and heat exchange is performed between the second internally-circulated airflow and the second externally-circulated airflow. The air-cooled heat exchanger further includes a first internal driving device disposed in the first internal circulation path for driving the first internally-circulated airflow to flow along the first internal circulation path, and a second internal driving device disposed in the second internal circulation path for driving the second internally-circulated airflow to flow along the second internal circulation path. The first and second external circulation paths extend substantially along two different directions. The first and second external circulation paths extend substantially along two opposite directions along a same axis. The first internal driving device, the second internal driving device and the external driving device can be centrifugal fans or axial-flow fans. The first and second externally-circulated airflows are substantially guided in different directions. Preferably, the first and second externally-circulated airflows are substantially guided in two opposite directions along a same axis. The air-cooled heat exchanger further includes a casing comprising an accommodating space, a first heat-exchanging core installed within the accommodating space, wherein the first heat-exchanging core and the casing define the first internal circulation path and the first external circulation path, which are separated from each other, and a second heat-exchanging core installed within the accommodating space, wherein the second heat-exchanging core and the casing define the second internal circulation path and the second external circulation path, which are separated from each other.

In accordance with an aspect of the present invention, the casing is substantially a rectangular box and the external driving device is substantially disposed at a central portion of the rectangular box. The casing further includes a common air gate and the external driving device is disposed in the common air gate of the first external circulation path and the second external circulation path. The first heat-exchanging core, the second heat-exchanging core, the first internal driving device, the second internal driving device and the external driving device are installed within the accommodating space of the casing.

In accordance with an aspect of the present invention, the first heat-exchanging core is disposed between the first internal driving device and the external driving device, and the second heat-exchanging core is disposed between the second internal driving device and the external driving device. The first heat-exchanging core includes a plurality of first internal circulation channels and a plurality of first external circulation channels, wherein the a plurality of first internal circulation channels and the a plurality of first external circulation channels are alternately disposed and separated from each other by a plurality of partitions. The plurality of first internal circulation channels and the casing define the first internal circulation path, and the plurality of first external circulation channels and the casing define the first external circulation path. The second heat-exchanging core includes a plurality of second internal circulation channels and a plurality of second external circulation channels, wherein the a plurality of second internal circulation channels and the plurality of second external circulation channels are alternately disposed and separated from each other by a plurality of partitions.

In accordance with another aspect of the present invention, an electronic device is provided. An electronic device includes a sealed cabinet, at least one electronic component installed within the sealed cabinet, and an air-cooled heat exchanger installed within the sealed cabinet. The air-cooled heat exchanger includes a first internal circulation path, a first external circulation path, a second internal circulation path, a second external circulation path, and an external driving device.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
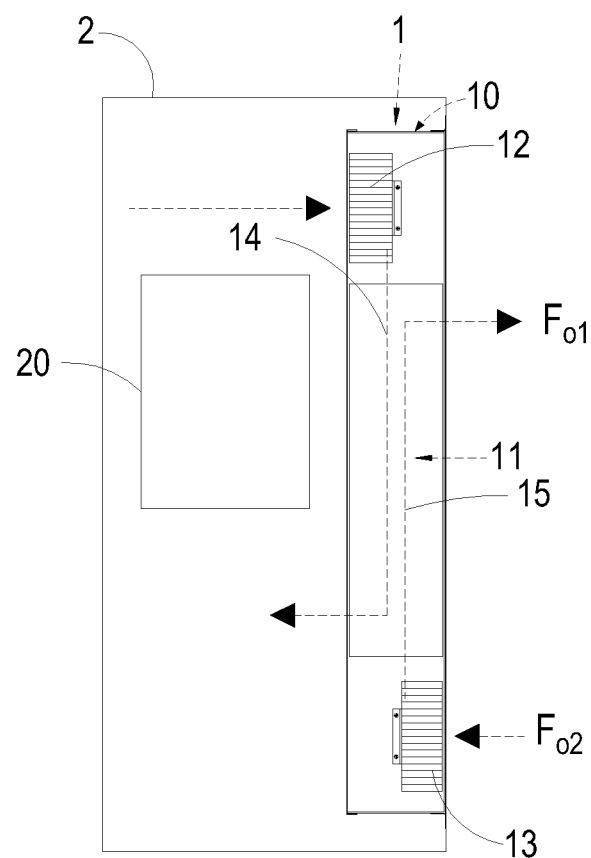
FIG. 1 is a schematic view illustrating a conventional air-cooled heat exchanger.
Figure 2:
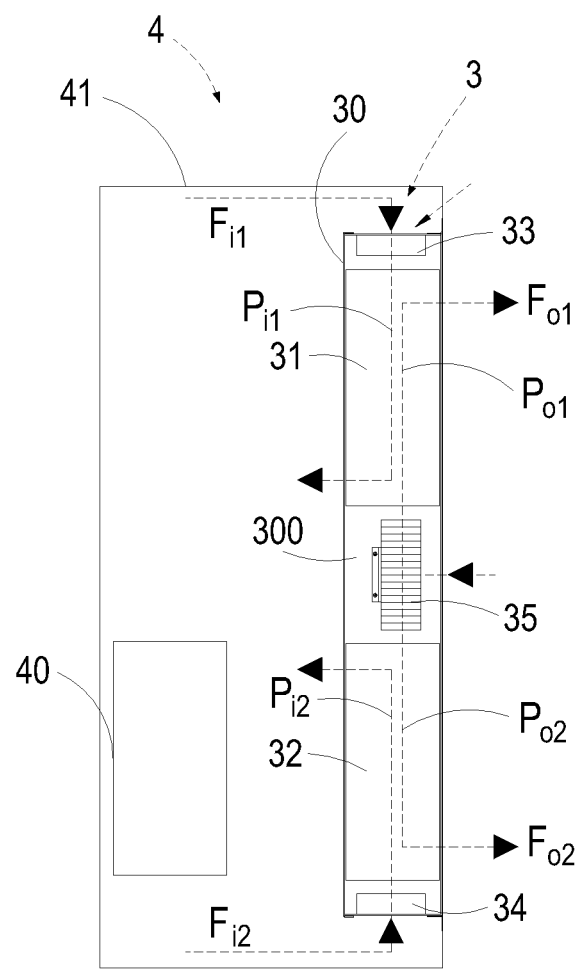
FIG. 2 is a schematic view illustrating an air-cooled heat exchanger according to an embodiment of the present invention.

FIG. 2 is a schematic view illustrating an air-cooled heat exchanger according to an embodiment of the present invention. The air-cooled heat exchanger 3 is applied to an electronic device 4 such as a data processing device, a communication device, a network device or a power supply apparatus. The air-cooled heat exchanger 3 is configured to dissipate away the heat of the electronic component 40 within the electronic device 4, thereby cooling the electronic component 40. The electronic device 4 includes a sealed cabinet 41. It is preferred that the air-cooled heat exchanger 3 is installed within the sealed cabinet 41. In this embodiment, the air-cooled heat exchanger 3 includes a casing 30, a first heat-exchanging core 31, a second heat-exchanging core 32, a first internal driving device 33, a second internal driving device 34 and an external driving device 35. The casing 30 has an accommodating space 300. The first heat-exchanging core 31 is installed within the accommodating space 300 of the casing 30. The first heat-exchanging core 31 and the casing 30 define a first internal circulation path $P_{i1}$ and a first external circulation path $P_{o1}$, which are separated from each other. The second heat-exchanging core 32 is also installed within the accommodating space 300 of the casing 30. The second heat-exchanging core 32 and the casing 30 define a second internal circulation path $P_{i2}$ and a second external circulation path $P_{o2}$, which are separated from each other. The first internal driving device 33 is disposed in the first internal circulation path $P_{i1}$ for driving a first internally-circulated airflow $F_{i1}$ to flow along the first internal circulation path $P_{i1}$. The second internal driving device 34 is disposed in the second internal circulation path $P_{i2}$ for driving a second internally-circulated airflow $F_{i2}$ to flow along the second internal circulation path $P_{i2}$. The external driving device 35 is disposed in the first external circulation path $P_{o1}$ and the second external circulation path $P_{o2}$ for driving a first externally-circulated airflow $F_{o1}$ to flow along the first external circulation path $P_{o1}$ and driving a second externally-circulated airflow $F_{o2}$ to flow along the second external circulation path $P_{o2}$. The first and second internal driving devices 33, 34 and the external driving device 35 can be centrifugal fans or axial-flow fans. The first heat-exchanging core 32 is configured to perform heat exchange between the first internally-circulated airflow $F_{i1}$ and the first externally-circulated airflow $F_{o1}$. The second heat-exchanging core 33 is configured to perform heat exchange between the second internally-circulated airflow $F_{i2}$ and the second externally-circulated airflow $F_{o2}$. The heat conduction material includes at least one sheet of metal or heat-sink.

Figure 3A:
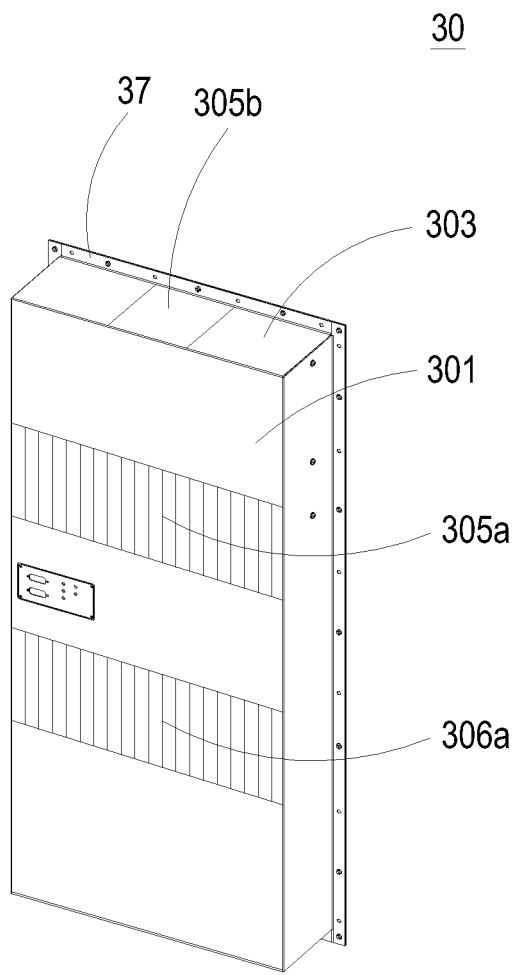
FIG. 3A is a schematic front view illustrating the air-cooled heat exchanger of FIG. 2.
Figure 3B:
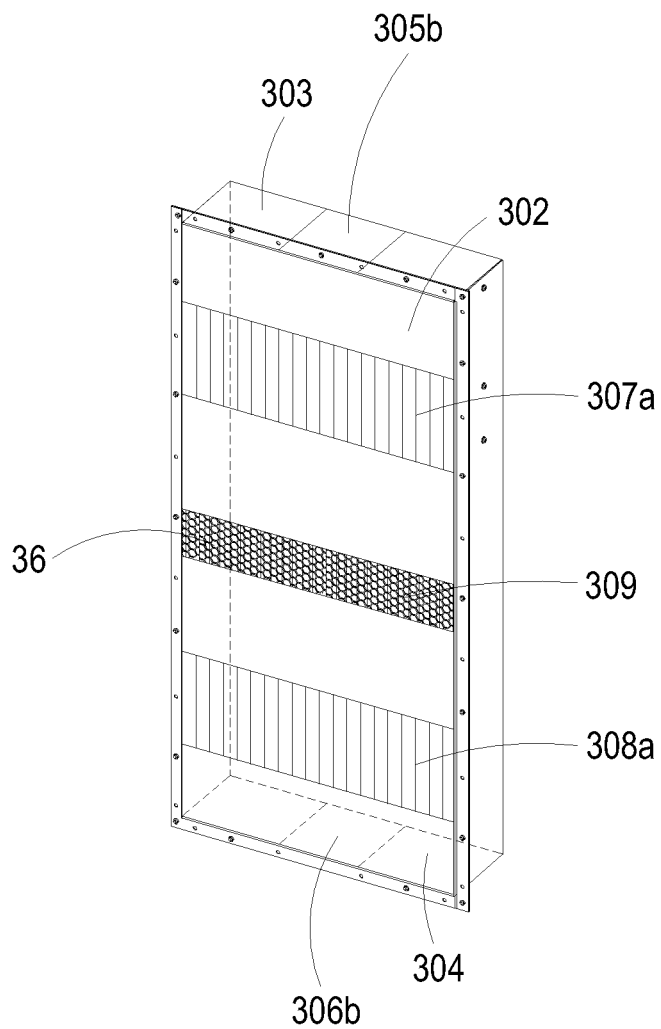
FIG. 3B is a schematic rear view illustrating the air-cooled heat exchanger of FIG. 2.

FIG. 3A is a schematic front view illustrating the air-cooled heat exchanger of FIG. 2. FIG. 3B is a schematic rear view illustrating the air-cooled heat exchanger of FIG. 2. Please refer to FIGS. 2, 3A and 3B. The first heat-exchanging core 31, the second heat-exchanging core 32, the first internal driving device 33, the second internal driving device 34 and the external driving device 35 are installed within the accommodating space 300 of the casing 30. The first heat-exchanging core 31 is disposed between the first internal driving device 33 and the external driving device 35. The second heat-exchanging core 32 is disposed between the second internal driving device 34 and the external driving device 35. As shown in FIGS. 3A and 3B, the casing 30 includes a first side plate 301, a second side plate 302, a third side plate 303 and a fourth side plate 304. The first side plate 301 and the second side plate 302 are opposed to each other. The third side plate 303 and the fourth side plate 304 are opposed to each other. A first air gate 305a of the first internal circulation path $P_{i1}$ and a first air gate 306a of the second internal circulation path $P_{i2}$ are formed in the first side plate 301 of the casing 30. A second air gate 305b of the first internal circulation path $P_{i1}$ is formed in the third side plate 303 of the casing 30. A second air gate 306b of the second internal circulation path $P_{i2}$ is formed in the fourth side plate 304 of the casing 30. In addition, a first air gate 307a of the first external circulation path $P_{o1}$ and a first air gate 308a of the second external circulation path $P_{o2}$ are formed in the second side plate 302 of the casing 30. A second air gate of the first external circulation path $P_{o1}$ and a second air gate of the second external circulation path $P_{o2}$ are defined as a common air gate 309. The common air gate 309 is disposed between the first air gate 307a of the first external circulation path $P_{o1}$ and the first air gate 308a of the second external circulation path $P_{o2}$. The external driving device 35 is disposed in the common air gate 309 for driving the outside gas into the first external circulation path $P_{o1}$ and the second external circulation path $P_{o2}$ at the same time.

Please refer to FIGS. 3A and 3B again. For protecting the air-cooled heat exchanger 3, one or more filters 36 are optionally installed in corresponding air gates 305a, 305b, 306a, 306b, 307a, 308a and 309. It is preferred that the filter 36 is installed in the common air gate 309 for preventing foreign article from entering the first external circulation path and the second external circulation path. The casing 30 further includes an auxiliary fixing device 37 for facilitating fixing the casing 30 on an inner surface of the sealed cabinet 41 of the electronic device 4.

Please refer to FIGS. 2 and 3A again. The first internal driving device 33 is disposed beside the first air gate 305a or the second air gate 305b of the first internal circulation path $P_{i1}$. It is preferred that the first internal driving device 33 is disposed beside the second air gate 305b of the first internal circulation path $P_{i1}$. The second internal driving device 34 is disposed beside the first air gate 306a or the second air gate 306b of the second internal circulation path $P_{i2}$. It is preferred that the second internal driving device 34 is disposed beside the second air gate 306b of the second internal circulation path $P_{i2}$. The external driving device 35 is disposed in the common air gate 309 of the first external circulation path $P_{o1}$ and the second external circulation path $P_{o2}$ for driving the outside gas into the first external circulation path $P_{o1}$ and the second external circulation path $P_{o2}$ at the same time.

Figure 4A:
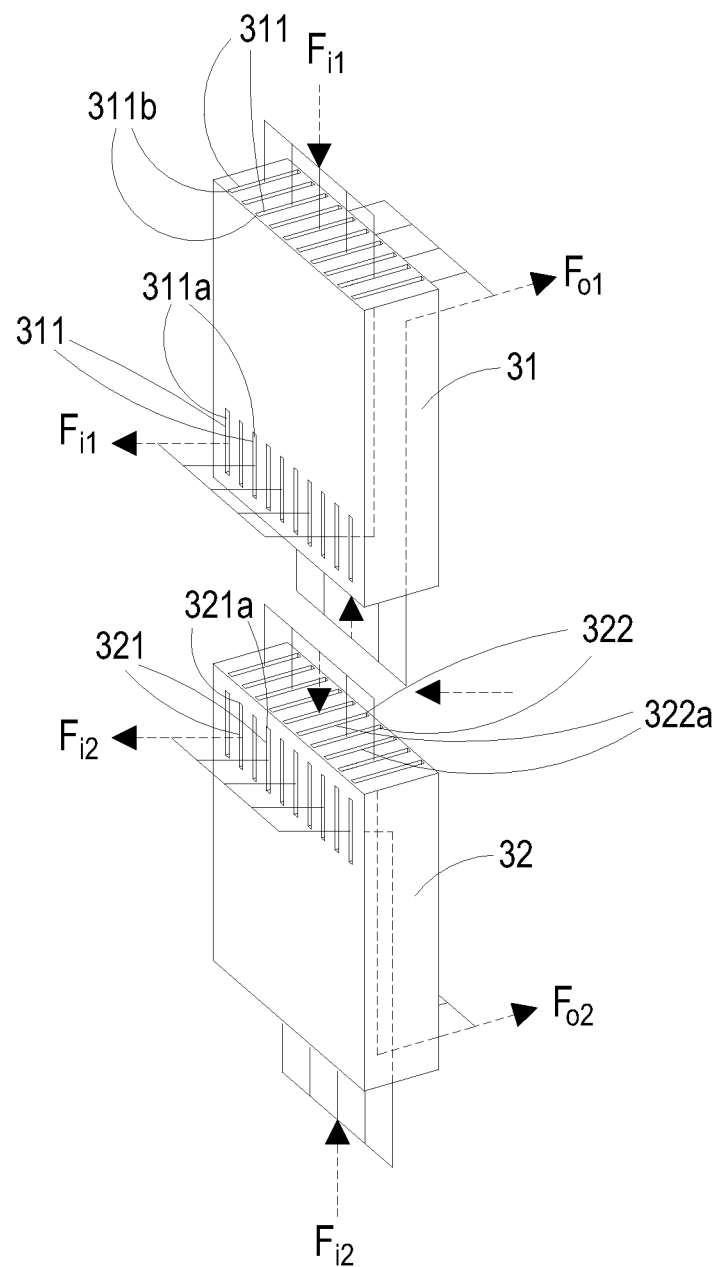
FIGS. 4A and 4B are schematic perspective views illustrating the first heat-exchanging core and the second heat-exchanging core of the air-cooled heat exchanger of FIG. 2 and taken from different directions.
Figure 4B:
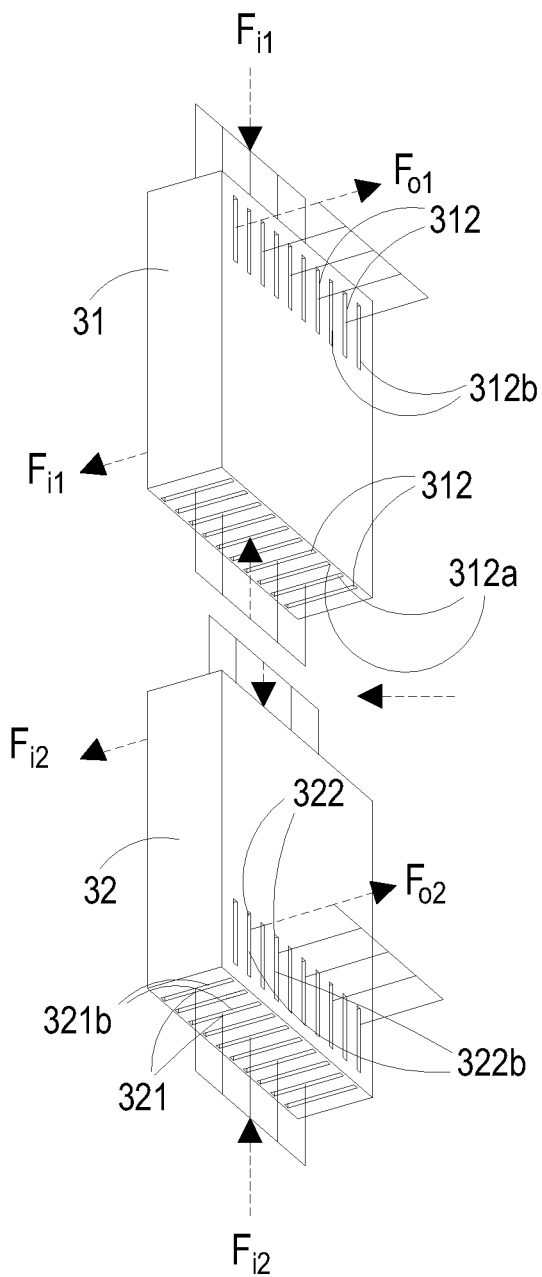

FIGS. 4A and 4B are schematic perspective views illustrating the first heat-exchanging core and the second heat-exchanging core of the air-cooled heat exchanger of FIG. 2 and taken from different viewpoints. Please refer to FIGS. 2, 3A, 3B, 4A and 4B. The first heat-exchanging core 31 includes a plurality of first internal circulation channels 311 and a plurality of first external circulation channels 312. The plurality of first internal circulation channels 311 and the casing 30 define the first internal circulation path $P_{i1}$. The plurality of first external circulation channels 312 and the casing 30 define the first external circulation path $P_{o1}$. As shown in FIGS. 4A and 4B, the plurality of first internal circulation channels 311 and the plurality of first external circulation channels 312 are alternately disposed, and separated from each other by a plurality of partitions (not shown). The first internal circulation channels 311 have respective first openings 311a and respective second openings 311b. The first external circulation channels 312 have respective first openings 312a and respective second openings 312b. The first openings 311a and the second openings 311b of the first internal circulation channels 311 are disposed beside the first air gate 305a and the second air gate 305b of the first internal circulation path $P_{i1}$, respectively. The first openings 312a and the second openings 312b of the first external circulation channels 312 are disposed beside the common air gate 309 and the first air gate 307a of the first external circulation path $P_{o1}$, respectively.

The second heat-exchanging core 32 includes a plurality of second internal circulation channels 321 and a plurality of second external circulation channels 322. The plurality of second internal circulation channels 321 and the casing 30 define the second internal circulation path $P_{i2}$. The plurality of second external circulation channels 322 and the casing 30 define the second external circulation path $P_{o2}$. As shown in FIGS. 4A and 4B, the plurality of second internal circulation channels 321 and the plurality of second external circulation channels 322 are alternately disposed, and separated from each other by a plurality of partitions (not shown). The second internal circulation channels 321 have respective first openings 321a and respective second openings 321b. The second external circulation channels 322 have respective first openings 322a and respective second openings 322b. The first openings 321a and the second openings 321b of the second internal circulation channels 321 are disposed beside the first air gate 306a and the second air gate 306b of the second internal circulation path $P_{i2}$, respectively. The first openings 322a and the second openings 322b of the second external circulation channels 322 are disposed beside the common air gate 309 and the first air gate 308a of the second external circulation path $P_{o2}$, respectively.

In an embodiment, the first internal driving device 33, the second internal driving device 34 and the external driving device 35 are centrifugal fans or axial-flow fans. In some embodiments, each of the first internal driving device 33, the second internal driving device 34 and the external driving device 35 includes one or more centrifugal fans or axial-flow fans. In an embodiment, each of the first heat-exchanging core 31 and the second heat-exchanging core 32 is a heat sink module comprising a plurality of parallel and stacked aluminum slices, which collectively define the plurality of partitions, the internal circulation channels and the external circulation channels. In addition, every two adjacent circulation channels are different circulation channels so that the internal circulation channels and the external circulation channels are alternately disposed.

Hereinafter, the operations of the air-cooled heat exchanger will be illustrated with reference to FIGS. 2, 3A and 3B. The first internally-circulated airflow $F_{i1}$ and the second internally-circulated airflow $F_{i2}$ are respectively inhaled by the first internal driving device 33 and the second internal driving device 34 so that heated airflow from the electronic component 40 of the electronic device 4 is guided into the first internal circulation path $P_{i1}$ and the second internal circulation path $P_{i2}$ through the second air gates 305b and 306b. In addition, the first internally-circulated airflow $F_{i1}$ and the second internally-circulated airflow $F_{i2}$ are respectively exhausted outside the casing 30 through the first air gates 305a and 306a. The cooled ambient airflow is inhaled by the external driving device 35 so that the first externally-circulated airflow $F_{o1}$ and the second externally-circulated airflow $F_{o2}$ are respectively guided to the first external circulation path $P_{o1}$ and the second external circulation path $P_{o2}$ through the common air gate 309. In addition, the first externally-circulated airflow $F_{o1}$ and the second externally-circulated airflow $F_{o2}$ are guided to the surroundings through the first air gates 307a and 308a, respectively. Through the area of the plurality of partitions of the first heat-exchanging core 31, the heat exchange between the first internally-circulated airflow $F_{i1}$ and the first externally-circulated airflow $F_{o1}$ will be performed. Consequently, the first internally-circulated airflow $F_{i1}$ is cooled down to dissipate away the heat of the electronic component 40, and the first externally-circulated airflow $F_{o1}$ is a hot airflow to be exhausted outside the electronic device 4. Similarly, through the area of the plurality of partitions of the second heat-exchanging core 32, the heat exchange between the second internally-circulated airflow $F_{i2}$ and the second externally-circulated airflow $F_{o2}$ will be performed. Consequently, the second internally-circulated airflow $F_{i2}$ is cooled down to dissipate away the heat of the electronic component 40, and the second externally-circulated airflow $F_{o2}$ is a hot airflow to be exhausted outside the electronic device 4.

Figure 5:
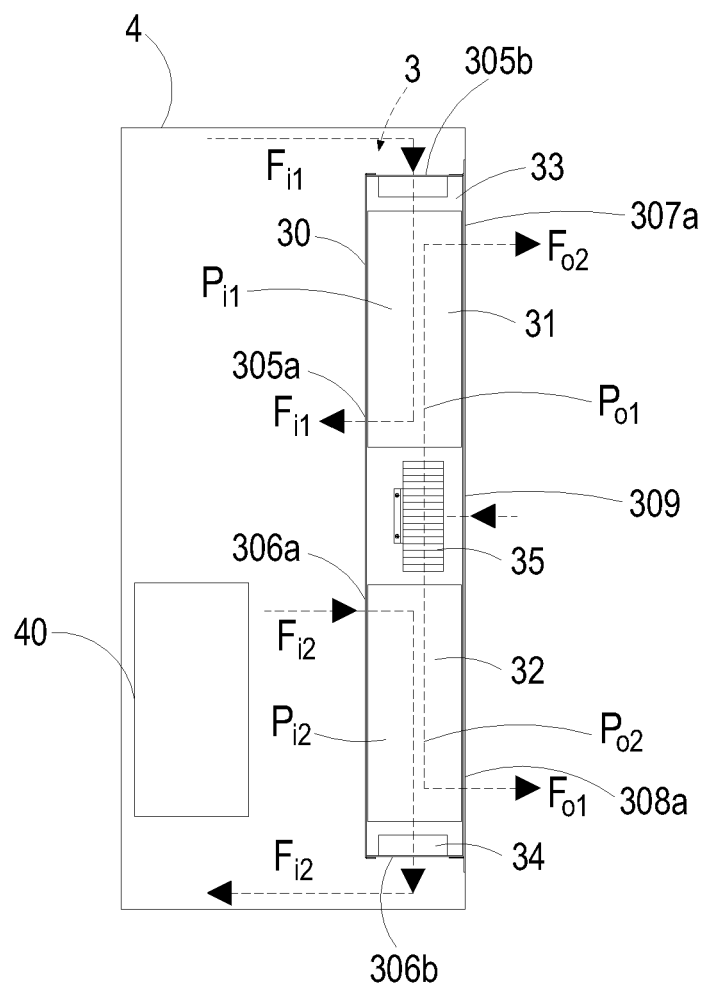
FIG. 5 is a schematic view illustrating an air-cooled heat exchanger according to another embodiment of the present invention.

FIG. 5 is a schematic view illustrating an air-cooled heat exchanger according to another embodiment of the present invention. Hereinafter, the operations of the air-cooled heat exchanger will be illustrated with reference to FIG. 5. The first internally-circulated airflow $F_{i1}$ and the second internally-circulated airflow $F_{i2}$ are respectively inhaled by the first internal driving device 33 and the second internal driving device 34 so that heated airflow from the electronic component 40 of the electronic device 4 is guided into the first internal circulation path $P_{i1}$ and the second internal circulation path $P_{i2}$ through the second air gates 305b and the first air gate 306a. In addition, the first internally-circulated airflow $F_{i1}$ and the second internally-circulated airflow $F_{i2}$ are respectively exhausted outside the casing 30 through the first air gates 305a and the second air gate 306b. The cooled ambient airflow is inhaled by the external driving device 35 so that the first externally-circulated airflow $F_{o1}$ and the second externally-circulated airflow $F_{o2}$ are respectively guided to the first external circulation path $P_{o1}$ and the second external circulation path $P_{o2}$ through the common air gate 309. In addition, the first externally-circulated airflow $F_{o1}$ and the second externally-circulated airflow $F_{o2}$ are guided to the surroundings through the first air gates 307a and 308a, respectively. Through the area of the plurality of partitions of the first heat-exchanging core 31, the heat exchange between the first internally-circulated airflow $F_{i1}$ and the first externally-circulated airflow $F_{o1}$ will be performed. Consequently, the first internally-circulated airflow $F_{i1}$ is cooled down to dissipate away the heat of the electronic component 40, and the first externally-circulated airflow $F_{o1}$ is a hot airflow to be exhausted outside the electronic device 4. Similarly, through the area of the plurality of partitions of the second heat-exchanging core 32, the heat exchange between the second internally-circulated airflow $F_{i2}$ and the second externally-circulated airflow $F_{o2}$ will be performed. Consequently, the second internally-circulated airflow $F_{i2}$ is cooled down to dissipate away the heat of the electronic component 40, and the second externally-circulated airflow $F_{o2}$ is a hot airflow to be exhausted outside the electronic device 4.

As previously described, since the conventional air-cooled heat exchanger has a single heat-exchanging core, the overall length of the internal circulation path and the external circulation path is too long, the wind resistance is increased, the airflow capacity is too low and the heat-dissipating efficacy is insufficient. Whereas, the air-cooled heat exchanger of the present invention uses two heat-exchanging cores. Due to the two heat-exchanging cores, the overall length of the internal circulation path and the external circulation path is reduced and the wind resistance is reduced. Assuming that the volume of the heat exchanger is identical, the heat-dissipating efficacy is enhanced. Moreover, as the size of the heat-exchanging core is increased, the cost of fabricating the heat-exchanging core is effectively reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An air-cooled heat exchanger comprising:
   a casing comprising an accommodating space;
   a first heat-exchanging core installed within the accommodating space, wherein the first heat-exchanging core and the casing define a first internal circulation path and a first external circulation path, which are separated from each other; and
   a second heat-exchanging core installed within the accommodating space, wherein the second heat-exchanging core and the casing define a second internal circulation path and a second external circulation path, which are separated from each other; and
   a single external driving device disposed in the first external circulation path and the second external circulation path at the same time.

2. The air-cooled heat exchanger according to claim 1, wherein the casing is substantially a rectangular box and the external driving device is substantially disposed at a central portion of the rectangular box.

3. The air-cooled heat exchanger according to claim 1, wherein the casing further comprises a common air gate and the external driving device is disposed in the common air gate of the first and second external circulation paths.

4. The air-cooled heat exchanger according to claim 1, wherein the first and second external circulation paths extend substantially along two different directions.

5. The air-cooled heat exchanger according to claim 1, wherein the first and second external circulation paths extend substantially along two opposite directions along a same axis.

6. The air-cooled heat exchanger according to claim 1, wherein the first internal circulation path is utilized for guiding a first internally-circulated airflow, the first external circulation path is disposed next to the first internal circulation path for guiding a first externally-circulated airflow, the second internal circulation path is utilized for guiding a second internally-circulated airflow, the second external circulation path is disposed next to the second internal circulation path for guiding a second externally-circulated airflow, and the external driving device is utilized for driving the first and second externally-circulated airflows at the same time.

7. The air-cooled heat exchanger according to claim 6, wherein heat exchange is performed between the first internally-circulated airflow and the first externally-circulated airflow, and heat exchange is performed between the second internally-circulated airflow and the second externally-circulated airflow.

8. The air-cooled heat exchanger according to claim 6, further comprising:
   a first internal driving device disposed in the first internal circulation path for driving the first internally-circulated airflow to flow along the first internal circulation path; and
   a second internal driving device disposed in the second internal circulation path for driving the second internally-circulated airflow to flow along the second internal circulation path.

9. The air-cooled heat exchanger according to claim 8, wherein the first internal driving device, the second internal driving device and the external driving device are centrifugal fans or axial-flow fans.

10. The air-cooled heat exchanger according to claim 8, wherein the first internal driving device, the second internal driving device and the external driving device are installed within the accommodating space of the casing.

11. The air-cooled heat exchanger according to claim 8, wherein the first heat-exchanging core is disposed between the first internal driving device and the external driving device, and the second heat-exchanging core is disposed between the second internal driving device and the external driving device.

12. The air-cooled heat exchanger according to claim 1, wherein the first heat-exchanging core comprises a plurality of first internal circulation channels and a plurality of first external circulation channels, wherein the plurality of first internal circulation channels and the plurality of first external circulation channels are alternately disposed and separated from each other by a plurality of partitions.

13. The air-cooled heat exchanger according to claim 12, wherein the plurality of first internal circulation channels and the casing define the first internal circulation path and the plurality of first external circulation channels and the casing define the first external circulation path.

14. The air-cooled heat exchanger according to claim 1, wherein the second heat-exchanging core comprises a plurality of second internal circulation channels and a plurality of second external circulation channels, wherein the plurality of second internal circulation channels and the plurality of second external circulation channels are alternately disposed and separated from each other by a plurality of partitions.

15. The air-cooled heat exchanger according to claim 14, wherein the plurality of second internal circulation channels and the casing define the second internal circulation path, and the plurality of second external circulation channels and the casing define the second external circulation path.

16. The air-cooled heat exchanger according to claim 1, wherein the first heat-exchanging core and the second heat-exchanging core are heat sink modules, each of which comprises a plurality of stacked aluminum slices.

17. An electronic device, comprising:
a sealed cabinet;
at least one electronic component installed within the sealed cabinet; and
an air-cooled heat exchanger installed within the sealed cabinet, and comprising:
   a casing comprising an accommodating space;
   a first heat-exchanging core installed within the accommodating space, wherein the first heat-exchanging core and the casing define a first internal circulation path and a first external circulation path, which are separated from each other; and
   a second heat-exchanging core installed within the accommodating space, wherein the second heat-exchanging core and the casing define a second internal circulation path and a second external circulation path, which are separated from each other, wherein the first internal circulation path is utilized for guiding a first internally-circulated airflow, the first external circulation path is disposed next to the first internal circulation path for guiding a first externally-circulated airflow, the second internal circulation path is utilized for guiding a second internally-circulated airflow, and the second external circulation path is disposed next to the second internal circulation path for guiding a second externally-circulated airflow; and
   a single external driving device disposed in the first external circulation path and the second external circulation path at the same time for driving the first and second externally-circulated airflows at the same time.

18. The air-cooled heat exchanger according to claim 17, wherein the first and second externally-circulated airflows are guided in different directions.

19. The air-cooled heat exchanger according to claim 17, wherein the first and second externally-circulated airflows are substantially guided in two opposite directions along a same axis.

20. The air-cooled heat exchanger according to claim 17, wherein the casing further comprises an auxiliary fixing device for facilitating fixing the casing on an inner surface of the sealed cabinet of the electronic device.

* * * * *